United States Patent
Lu

(10) Patent No.: US 10,216,572 B2
(45) Date of Patent: Feb. 26, 2019

(54) FLASH CHANNEL CALIBRATION WITH MULTIPLE LOOKUP TABLES

(71) Applicant: NGD SYSTEMS, INC., Irvine, CA (US)

(72) Inventor: Guangming Lu, Irvine, CA (US)

(73) Assignee: NGD Systems, Inc., Invine, CA (US)

( * ) Notice: Subject to any disclaimer, the term of this patent is extended or adjusted under 35 U.S.C. 154(b) by 0 days.

(21) Appl. No.: 15/230,075

(22) Filed: Aug. 5, 2016

(65) Prior Publication Data

US 2017/0024279 A1 Jan. 26, 2017

Related U.S. Application Data

(63) Continuation-in-part of application No. 14/806,063, filed on Jul. 22, 2015, now abandoned.

(60) Provisional application No. 62/027,683, filed on Jul. 22, 2014.

(51) Int. Cl.
| | |
|---|---|
| *G06F 11/10* | (2006.01) |
| *H03M 13/05* | (2006.01) |
| *H03M 13/45* | (2006.01) |
| *G11C 11/56* | (2006.01) |
| *G11C 16/26* | (2006.01) |
| *G11C 29/02* | (2006.01) |
| *G11C 29/52* | (2006.01) |
| *G11C 29/42* | (2006.01) |

(52) U.S. Cl.
CPC ...... *G06F 11/1068* (2013.01); *G06F 11/1012* (2013.01); *G11C 11/5642* (2013.01); *G11C 16/26* (2013.01); *G11C 29/021* (2013.01); *G11C 29/028* (2013.01); *H03M 13/05* (2013.01); *H03M 13/45* (2013.01); *G11C 29/42* (2013.01); *G11C 29/52* (2013.01)

(58) Field of Classification Search
CPC ............ G06F 11/1076; G06F 11/1008; G06F 11/1068; G06F 11/1044; G06F 11/1012; H05K 999/99; G11C 29/028; G11C 29/021; G11C 11/5642; G11C 16/26; G11C 29/42; G11C 29/52; H03M 13/45; H03M 13/05
USPC ........................................................ 714/763
See application file for complete search history.

(56) References Cited

U.S. PATENT DOCUMENTS

| | | | | |
|---|---|---|---|---|
| 8,707,132 | B2 * | 4/2014 | Nakagawa | ............. H04N 1/405 345/537 |
| 8,924,824 | B1 | 12/2014 | Lu | |
| 9,244,763 | B1 * | 1/2016 | Kankani | ............. G06F 11/1008 |
| 2008/0106936 | A1 * | 5/2008 | Yang | ................... G11C 11/5628 365/185.03 |

(Continued)

*Primary Examiner* — Albert Decady
*Assistant Examiner* — Enam Ahmed
(74) *Attorney, Agent, or Firm* — Lewis Roca Rothgerber Christie LLP

(57) ABSTRACT

A system and method for generating lookup tables for use in an adaptive multiple-read system for reading flash memory. Successive different attempts are made to decode previously stored data using error correction codes, the attempts differing, for example, with respect to the combination of raw data words used for each attempt, each raw data word having been obtained by reading a code word of data using a different word line voltage. When a decoding attempt succeeds, log likelihood ratios are calculated from counts of flipped bits, i.e., bits in the raw data read from the memory having a different value than the corresponding bits in the decoded data.

21 Claims, 7 Drawing Sheets

(56) References Cited

U.S. PATENT DOCUMENTS

| | | | |
|---|---|---|---|
| 2010/0020611 A1* | 1/2010 | Park | G06F 11/1068 365/185.09 |
| 2013/0132652 A1* | 5/2013 | Wood | G06F 12/0246 711/103 |
| 2014/0056068 A1* | 2/2014 | Strasser | G06F 11/1048 365/185.03 |
| 2016/0274969 A1* | 9/2016 | Chen | G11C 29/52 |
| 2016/0306694 A1* | 10/2016 | Tai | G06F 11/1068 |

* cited by examiner

FLASH CHANNEL CALIBRATION WITH MULTIPLE LOOKUP TABLES

CROSS-REFERENCE TO RELATED APPLICATION(S)

The present application is a continuation-in-part of U.S. patent application Ser. No. 14/806,063, filed Jul. 22, 2015, entitled "METHOD OF FLASH CHANNEL CALIBRATION WITH MULTIPLE LUTS FOR ADAPTIVE MULTIPLE-READ", which claims priority to and the benefit of U.S. Provisional Application No. 62/027,683, filed Jul. 22, 2014, entitled "METHOD OF FLASH CHANNEL CALIBRATION WITH MULTIPLE LUTS FOR ADAPTIVE MULTIPLE-READ", the entire contents of both of which are incorporated herein by reference.

FIELD

One or more aspects of embodiments according to the present invention relate to a method of flash channel calibration with multiple lookup tables (LUTs) for adaptive multiple-read.

BACKGROUND

As the feature size of lithographic geometry for NAND flash chips is decreased, the number of electrons that can be used in storage may also be reduced, and assuring accurate information storage may become more challenging. Moreover, reductions in feature size may increase the risk of inter-cell interference. High-capacity NAND flash memory may achieve high density storage by using multi-level cells (two bits/cell for multi-level cell (MLC) or three bits/cell for triple level cell (TLC)) to store more than one bit per cell. Four levels or eight levels or more may be used. A large number of levels (and small voltage differences between levels) may result in a relatively low signal-to-noise ratio of the read channel, and a relatively high raw bit error rate (RBER). Error-correction code (ECC) (e.g., a low density parity check (LDPC) code) may be used to mitigate read errors.

The use of an LDPC code may involve reading the flash memory multiple times, which may degrade the performance of the flash memory. Thus, there is a need for a system and method for reading a flash memory multiple times, while providing good performance.

SUMMARY

Aspects of embodiments of the present disclosure are directed toward a system and method for generating lookup tables for use in an adaptive multiple-read system for reading flash memory. Successive different attempts are made to decode previously stored data using error correction codes, the attempts differing, for example, with respect to the combination of raw data words used for each attempt, each raw data word having been obtained by reading a code word of data using a different word line voltage. When a decoding attempt succeeds, log likelihood ratios are calculated from counts of flipped bits, i.e., bits in the raw data read from the memory having a different value than the corresponding bits in the decoded data.

According to an embodiment of the present invention there is provided a method for calibrating a flash memory, the method including: performing a first read operation on a first plurality of flash memory cells, at a first word line voltage, to form a first raw data word; performing a second read operation on the first plurality of flash memory cells, at a second word line voltage, to form a second raw data word; executing a first error correction code decoding attempt with a first set of one or more raw data words including the first raw data word; and when the first error correction code decoding attempt succeeds: generating, from bit differences between a second set of one or more raw data words and one or more corresponding decoded data words generated by the first error correction code decoding attempt, a first lookup table including: a first log likelihood ratio corresponding to a first range of word line voltages and a second log likelihood ratio corresponding to a second range of word line voltages; and generating, from bit differences between a second set of two or more raw data words and two or more corresponding decoded data words generated by the first error correction code decoding attempt, a second lookup table including: a third log likelihood ratio corresponding to a third range of word line voltages; a fourth log likelihood ratio corresponding to a fourth range of word line voltages; and a fifth log likelihood ratio corresponding to a fifth range of word line voltages.

In one embodiment, the third log likelihood ratio corresponds to the first range of word line voltages; the third log likelihood ratio equals the first log likelihood ratio; the fourth range of word line voltages is a sub-range of the second range of word line voltages; and the fifth range of word line voltages is a sub-range of the second range of word line voltages.

In one embodiment, the method includes, when the first error correction code decoding attempt succeeds: generating, from bit differences between a third set of three or more raw data words and three or more corresponding decoded data words generated by the first error correction code decoding attempt, a third lookup table including: a sixth log likelihood ratio corresponding to a sixth range of word line voltages; a seventh log likelihood ratio corresponding to a seventh range of word line voltages; an eighth log likelihood ratio corresponding to an eighth range of word line voltages; and a ninth log likelihood ratio corresponding to a ninth range of word line voltages.

In one embodiment, the first error correction code decoding attempt is a soft decision input error correction code decoding attempt.

In one embodiment, the first error correction code decoding attempt includes a decoding attempt utilizing a low density parity check algorithm.

In one embodiment, the method includes, when the first error correction code decoding attempt does not succeed, executing a second error correction code decoding attempt with one or more raw data words not including the first raw data word.

In one embodiment, the method includes, when the first error correction code decoding attempt does not succeed, executing a second error correction code decoding attempt with one or more raw data words not including the first raw data word.

In one embodiment, the second error correction code decoding attempt is a soft decision input error correction code decoding attempt.

In one embodiment, the second error correction code decoding attempt is a hard decision input error correction code decoding attempt.

In one embodiment, the method includes, when the first error correction code decoding attempt does not succeed, generating the first lookup table and the second lookup table from bit differences between the one or more raw data words and a data set reconstructed from separately stored information.

In one embodiment, the first log likelihood ratio is a logarithm of a ratio of a probability of a threshold word line voltage, at which a flash memory cell transistor is configured to transition between an on state and an off state, being within the first range of word line voltages if the flash memory cell was most recently programmed with a logical 1, and a probability of the threshold word line voltage being within the first range of word line voltages if the flash memory cell was most recently programmed with a logical 0.

According to an embodiment of the present invention there is provided a solid state drive, including: a controller; and flash memory, the controller being to: perform a first read operation on a first plurality of flash memory cells of the flash memory, at a first word line voltage, to form a first raw data word; perform a second read operation on the first plurality of flash memory cells, at a second word line voltage, to form a second raw data word; execute a first error correction code decoding attempt with a first set of one or more raw data words including the first raw data word; and when the first error correction code decoding attempt succeeds: generate, from bit differences between a second set of one or more raw data words and one or more corresponding decoded data words generated by the first error correction code decoding attempt, a first lookup table including: a first log likelihood ratio corresponding to a first range of word line voltages and a second log likelihood ratio corresponding to a second range of word line voltages; and generate, from bit differences between a second set of two or more raw data words and two or more corresponding decoded data words generated by the first error correction code decoding attempt, a second lookup table including: a third log likelihood ratio corresponding to a third range of word line voltages; a fourth log likelihood ratio corresponding to a fourth range of word line voltages; and a fifth log likelihood ratio corresponding to a fifth range of word line voltages.

In one embodiment, the controller is further configured to, when the first error correction code decoding attempt succeeds, generate, from bit differences between a third set of three or more raw data words and three or more corresponding decoded data words generated by the first error correction code decoding attempt, a third lookup table including: a sixth log likelihood ratio corresponding to a sixth range of word line voltages; a seventh log likelihood ratio corresponding to a seventh range of word line voltages; an eighth log likelihood ratio corresponding to an eighth range of word line voltages; and a ninth log likelihood ratio corresponding to a ninth range of word line voltages.

In one embodiment, the first error correction code decoding attempt is a soft decision input error correction code decoding attempt.

In one embodiment, the first error correction code decoding attempt includes a decoding attempt utilizing a low density parity check algorithm.

In one embodiment, the controller is further configured to, when the first error correction code decoding attempt does not succeed, execute a second error correction code decoding attempt with one or more raw data words not including the first raw data word.

In one embodiment, the controller is further configured to, when the first error correction code decoding attempt does not succeed, execute a second error correction code decoding attempt with one or more raw data words not including the first raw data word.

In one embodiment, the second error correction code decoding attempt is a soft decision input error correction code decoding attempt.

In one embodiment, the second error correction code decoding attempt is a hard decision input error correction code decoding attempt.

In one embodiment, the controller is further configured to, when the first error correction code decoding attempt does not succeed, generate the first lookup table and the second lookup table from bit differences between the one or more raw data words and a data set reconstructed from separately stored information.

In one embodiment, the first log likelihood ratio is a logarithm of a ratio of a probability of a threshold word line voltage, at which a flash memory cell transistor is configured to transition between an on state and an off state, being within the first range of word line voltages if the flash memory cell was most recently programmed with a logical 1, and a probability of the threshold word line voltage being within the first range of word line voltages if the flash memory cell was most recently programmed with a logical 0.

BRIEF DESCRIPTION OF THE DRAWINGS

These and other features and advantages of the present invention will be appreciated and understood with reference to the specification, claims and appended drawings wherein:

DETAILED DESCRIPTION

The detailed description set forth below in connection with the appended drawings is intended as a description of exemplary embodiments of a method of flash channel calibration provided in accordance with the present invention and is not intended to represent the only forms in which the present invention may be constructed or utilized. The description sets forth the features of the present invention in connection with the illustrated embodiments. It is to be understood, however, that the same or equivalent functions and structures may be accomplished by different embodiments that are also intended to be encompassed within the spirit and scope of the invention. As denoted elsewhere herein, like element numbers are intended to indicate like elements or features.

Figure 1A:
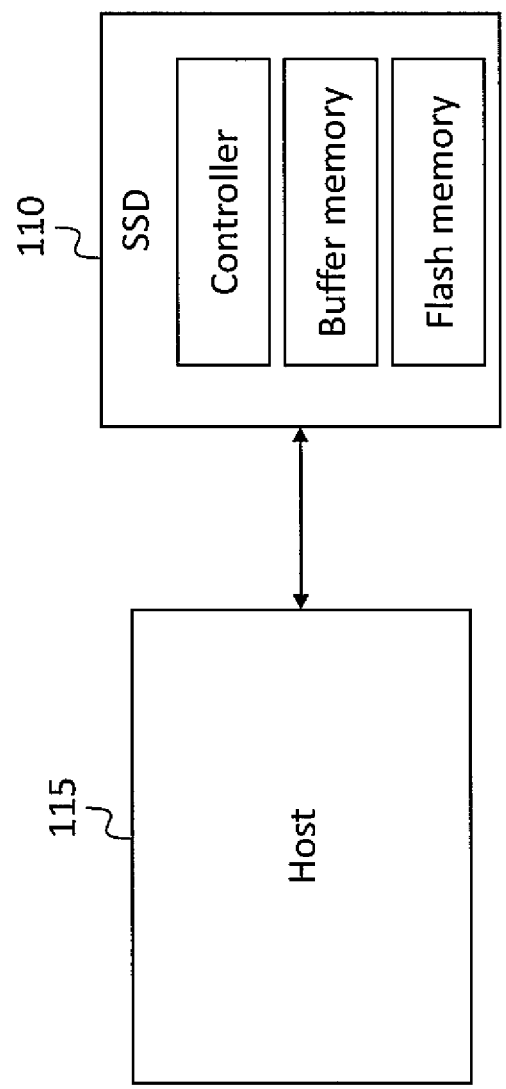
FIG. 1A is a block diagram of a host computer and a solid state drive, according to an embodiment of the present invention.

Referring to FIG. 1A, in some embodiments a solid state drive 110 may, in operation, be connected to, and provide storage for, a host 115, e.g., a server or other computer. The host interface (including the host connector, and the communications protocols) between the solid state drive 110 and the host may be, for example, a storage interface such as Serial Advanced Technology Attachment (SATA), Fibre Channel, Small Computer System Interface (SCSI), Serial Attached SCSI (SAS), Peripheral Component Interconnect Express (PCIe), Non Volatile Memory Express (NVMe), SCSI over PCIe, or a more general-purpose interface such as Ethernet or Universal Serial Bus (USB). In some embodiments, the solid state drive 110 may conform to a 3.5 inch hard drive form-factor (or "large form factor" (LFF)) standard, or it may conform to a 2.5 inch hard drive form-factor (or small form factor (SFF)) standard. In other embodiments the solid state drive 110 may conform to a standard PCIe card form factor, e.g., a full-height, full length (FH-FL) card outline, or a full-height, half length (FH-HL) outline. The solid state drive 110 may include a controller, buffer memory, and flash memory.

The flash memory may include a plurality of cells, each including a transistor with a floating gate. The cell may be programmed by a process that stores charge on the floating gate. The transistor includes an additional control gate, or "word line control gate" on top of the floating gate. When a voltage is applied to the word line control gate, the state of the transistor (whether on (e.g., conducting) or off (e.g., not conducting) depends both on the amount of charge stored on the floating gate, and on the voltage (or "word line voltage") applied to the word line control gate. Accordingly, the threshold voltage (i.e., the word line voltage at which the transistor transitions between the on state and the off state) depends on the amount of charge stored on the floating gate. The amount of charge stored on the floating gate may be used to store information. For example, in a single level cell (SLC), a large negative charge may represent 0 (or "'0'" or "logical 0") and a smaller negative charge or no negative charge may represent 1 ((or "'1'" or "logical 1"). In a multi-level cell (MLC), four different states, each corresponding to a different amount of charge stored on the floating gate may be used to store two bits, and in a Triple Level Cell (TLC)) eight different states may be used to store three bits.

The flash memory cell may be read by applying a reference voltage (i.e., setting the word line voltage to the reference voltage) and determining, using a sense amplifier comparator, whether the transistor is on or off. After the cell is programmed, the amount of charge stored on the floating gate may change gradually, resulting, on occasion, in a difference between a logical value (or "bit value") that was written to the cell and a bit value that is read from the cell. Such a difference may be referred to as a "bit flip". Whether a bit is flipped in a cell may depend on the reference voltage used to read the cell; in general, a bit may flip if the change in the amount of charge stored on the floating gate causes the threshold voltage to move from one side of the reference voltage to the other side of the reference voltage (e.g., causes the threshold voltage to change from being less than the reference voltage to being greater than the reference voltage). Error correcting codes may be used to correct errors resulting from bit flips. Such error correcting codes may use, as input, a quantity of data (i.e., a number of bits) referred to herein as a "code word".

In some embodiments, a plurality of flash memory cells may be read multiple times with multiple different values of the reference voltage (i.e., the voltage applied to the word line of the flash memory cells). Each reference voltage may be selected from a set of available reference voltages (e.g., voltages generated by a set of voltage sources, or by an analog to digital converter). After each read operation, the results, i.e., the raw data, may be fed to an error correcting code block which may attempt to decode the raw data (i.e., to correct any errors in the raw data). If the decoding attempt succeeds, the decoded data may, e.g., be delivered to the host. If the decoding attempt fails, an additional read may be performed, with another value of the reference voltage. This process, in which additional read operations are performed until error decoding succeeds, may be referred to as "adaptive multi-read". In this manner, the spending of time performing a third read may be avoided, for example, when after a second read, sufficient information has been obtained to perform a successful decoding operation.

Figure 1B:
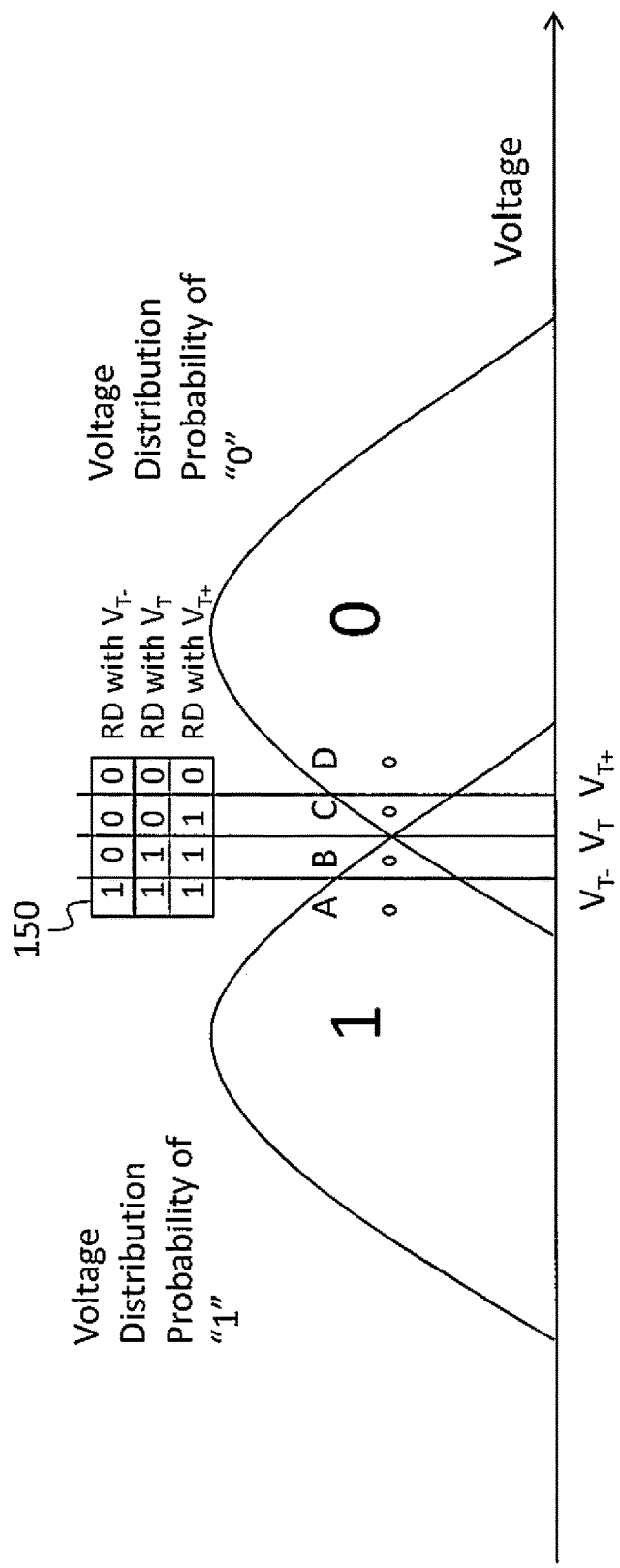
FIG. 1B is a graph of probability density functions, according to an embodiment of the present invention.

Each decoding attempt may employ a lookup table including an entry for each possible outcome for the set of read operations performed. During each read operation, the corresponding voltage may be applied to the word line, and a sense amplifier comparator may generate an output corresponding to, e.g., logical 1 if the flash cell transistor turns on at the current reference voltage, and logical 0 if it does not. Accordingly, the threshold voltage of the flash cell may be inferred to fall into one of a plurality of regions each bounded by one or two reference voltages. For example, in FIG. 1B, if read operations are performed with each of three available reference voltage values of $V_{T-}$, $V_T$, and $V_{T+}$, then, given the results of the read operations, the threshold voltage may be inferred to be in one of four regions, labelled A, B, C, and D in FIG. 1B, and corresponding respectively to threshold voltage values that are (i) less than $V_{T-}$, (ii) greater than $V_{T-}$ and less than $V_T$, (iii) greater than $V_T$ and less than and $V_{T+}$, and (iv) greater than $V_{T+}$. The read result table 150 of FIG. 1B shows the result of each of the read operations for each of these four cases. For example, if the threshold voltage is in region B, then the three reads (with reference voltages of $V_{T-}$, $V_T$, and $V_{T+}$) may generate raw data of {0,1,1}, as shown in the second column of the read result table 150.

The input to an error correcting decoder using soft decision values may include a log likelihood ratio (LLR) for each cell. The log likelihood ratio may be defined as $\log(P(0)/P(1))$ (where "log", without a subscript, refers to the natural logarithm) where P(0) is the probability of "0" being the bit that was written to the cell and P(1) is the probability of "1" being the bit that was written to the cell. This log likelihood ratio may be obtained from a lookup table that has one entry for each of the regions, e.g., four entries, corresponding to the regions A, B, C, and D of FIG. 1B. If adaptive multi-read is employed, several lookup tables may be present, one for each user-defined combination of reads (e.g., one for each user-defined read sequence). For example, a first read may be performed with a reference voltage of $V_T$, resulting in a 1 if the threshold voltage is in region A or B and a 0 if the threshold voltage is in region C or D. A first lookup table, corresponding to this first read, may then have two entries, one being the log likelihood ratio for a threshold voltage less than $V_T$ (corresponding to regions A and B) and the other being the log likelihood ratio for a threshold voltage greater than $V_T$ (corresponding to regions C and D).

A second lookup table may contain log likelihood ratios for, for example, the three possible results after a first read operation with a threshold voltage of $V_T$ and a second read operation with a threshold voltage of $V_{T-}$. A third lookup table may contain log likelihood ratios for the four possible results after a first read operation with a threshold voltage of $V_T$, a second read operation with a threshold voltage of $V_{T-}$, and a third read operation with a threshold voltage of $V_{T+}$.

Figure 2:
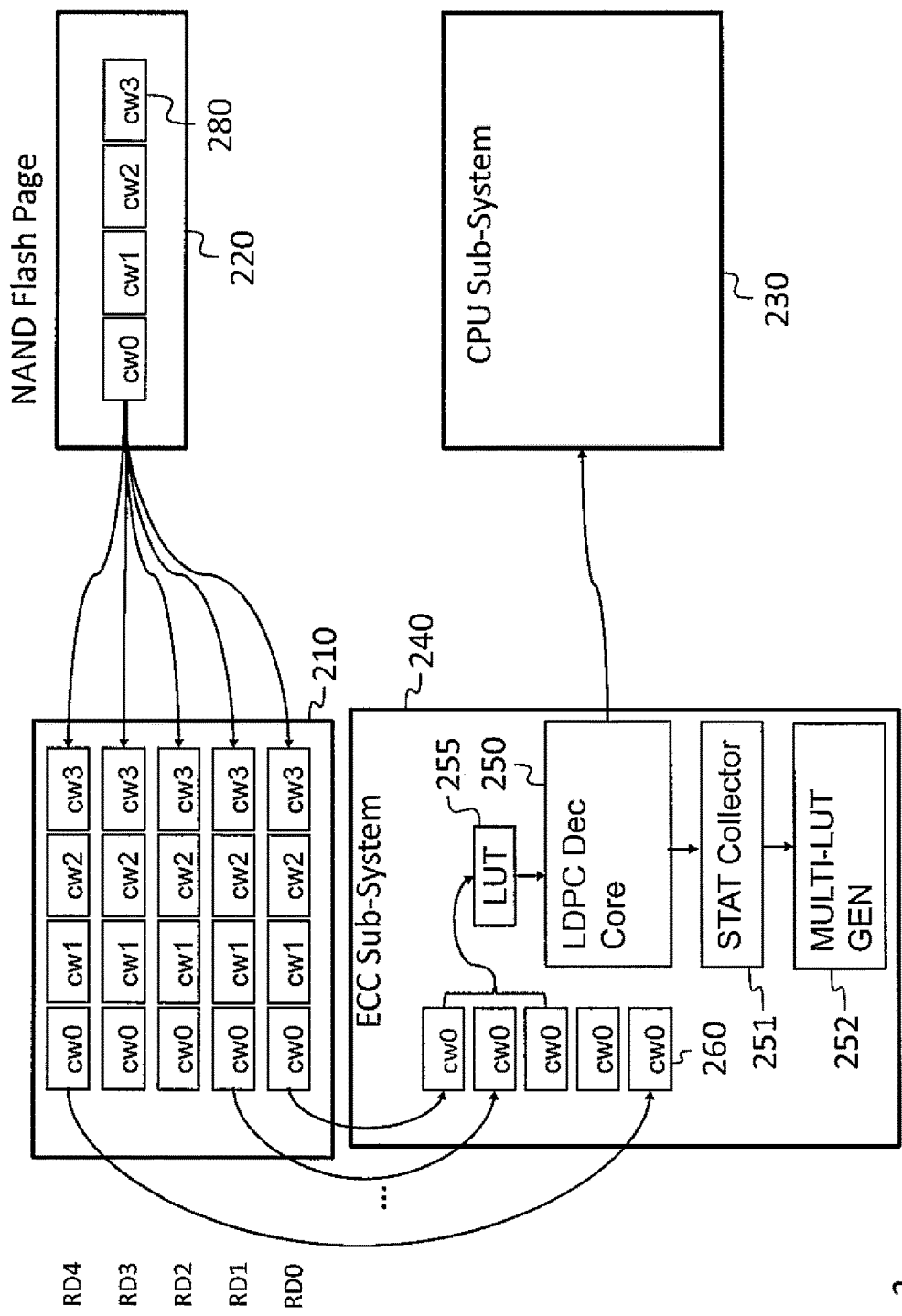
FIG. 2 is a block diagram of a system for calibrating flash memory to generate lookup tables, according to an embodiment of the present invention.

Although FIG. 1B illustrates an exemplary embodiment utilizing three different reference voltages; other embodiments may use fewer or more different reference voltages (e.g., five different reference voltages, as in the embodiment of FIG. 2).

FIG. 2 shows a multi-lookup table NAND flash channel calibration system according to one embodiment. It includes an intermediate buffer 210, NAND flash memory array 220, central processing unit (CPU) sub-system 230 and error correcting code (ECC) sub-system 240. In some embodiments, the calibration process begins with reading data from a NAND flash page 220 with each of the chosen and available reference voltages, to intermediate buffer 210. Only one code-word 280 may be read, or the entire page (multiple code-words) may be read. The process results in each code word being read multiple times, once for each of the chosen and available reference voltages. Each such read operation of a code word results in a quantity of data, referred to herein as a "raw data word". In FIG. 2, for example, five reads are performed, with five different reference voltages, resulting in the raw data words, in intermediate buffer 210, labeled "RD0" through "RD4" (there being, for example, five raw data words for code word 0 (cw0)). If the error correcting code is able to decode the raw data, then the contents of the lookup tables may be generated based on differences (e.g., bit flip counts) between one or more raw data words and the corresponding one or more decoded data words.

The intermediate buffer 210 sends the raw data words, to the ECC sub-system 240. The raw data words are stored in the local memory 260 inside the error correcting code sub-system. The low density parity check decoder 250 uses some or all of the raw data words in the local memory 260, along with an appropriate lookup table 255, and makes one or more error correction code decoding attempts. When a decoding attempt succeeds, the statistics collector 251 collects the 1 to 0 (or "O2z") bit flip count (i.e., it counts, for each reference voltage used, the number of bits that were written as 1 and read as 0), and/or the 0 to 1 (or "Z2o") bit flip count (i.e., it counts, for each reference voltage used, the number of bits that were written as 0 and read as 1) by comparing the decoded data with all of the raw data. A multi-LUT generation block 252 then generates or updates the multiple lookup tables. These new lookup tables may contain more accurate information (i.e., more accurate estimates of the log likelihood ratios), and accordingly may allow the adaptive multiple-read process to operate more efficiently (i.e., succeeding, on average, with a smaller number of reads). The central processing unit (CPU) subsystem 230 may read out the generated lookup tables from the multi-LUT generation block 252 and store it for future use, and/or store the results in the corresponding lookup tables 255.

Figure 3A:
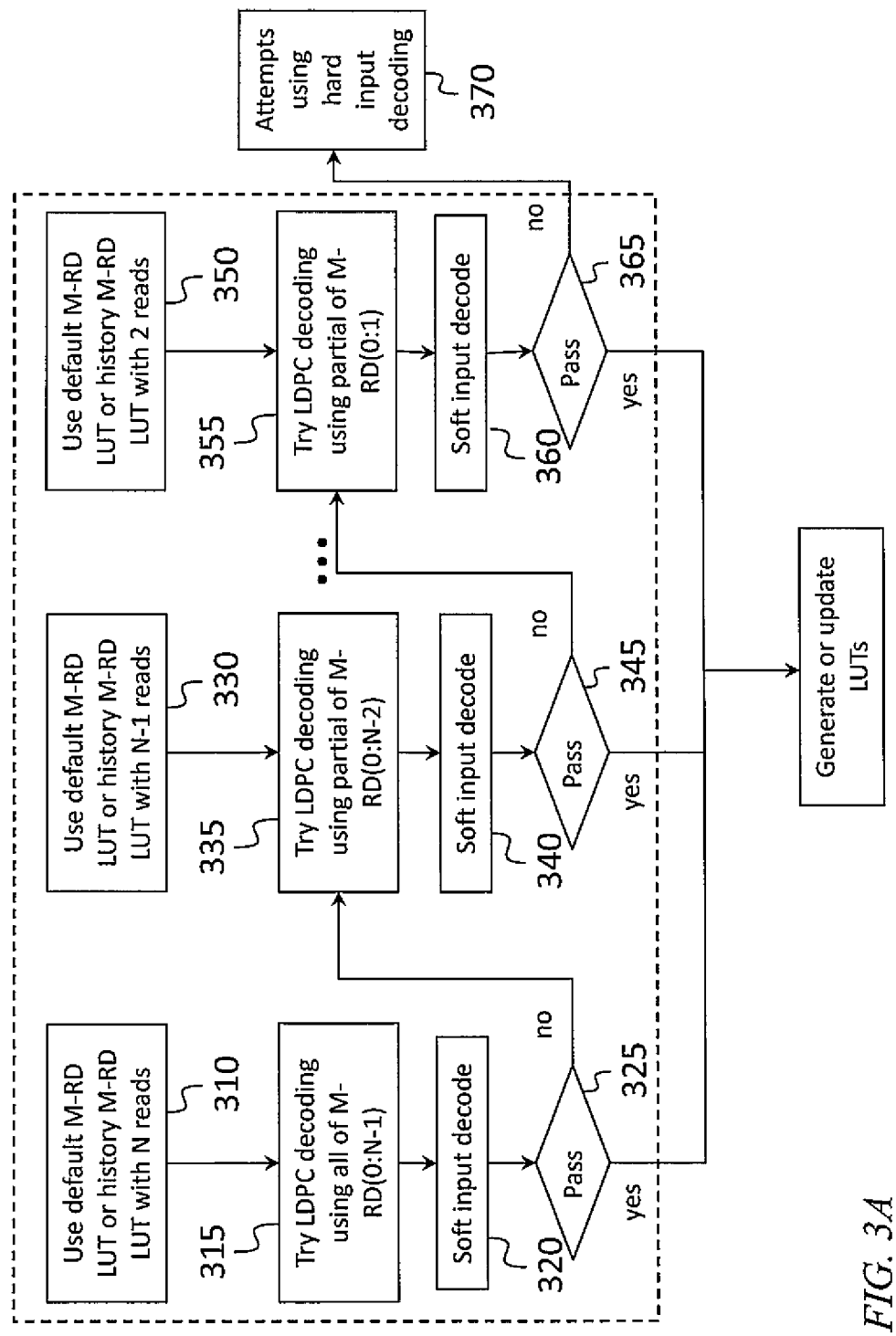
FIG. 3A is a flow chart of a portion of a method for calibrating flash memory, according to an embodiment of the present invention.
Figure 3B:
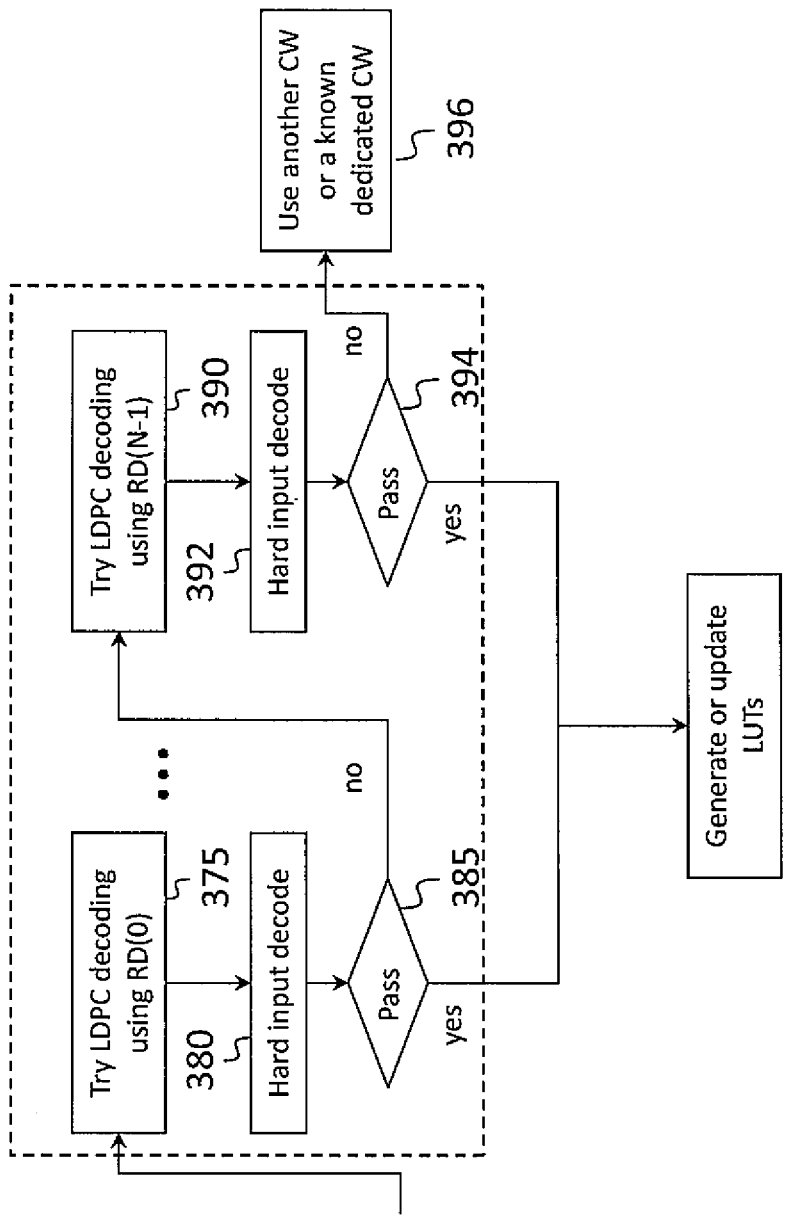
FIG. 3B is a flow chart of a portion of a method for calibrating flash memory, according to an embodiment of the present invention.

In some embodiments, the calibration processes utilizes a correctly decoded code-word, and all of the raw data words, to generate the lookup tables. Referring to FIGS. 3A and 3B, the decoding process may include one or more attempts using soft decision input decoding (FIG. 3A) and one or more attempts using hard decision input decoding (FIG. 3B). FIG. 3A shows a plurality of error correction code decoding attempts. For example, in acts 310, 315, and 320, a default multiple-read (M-RD) lookup table or historical multiple-read lookup table is used, with N reads (where N is the number of different reference voltages available to be used), and low density parity check (LDPC) soft-input decoding is attempted, using all of the raw data words. A default lookup table may be based on an ideal mathematical model of the Gaussian distribution of threshold voltage of flash memory transistors; a historical lookup table may be a lookup table generated by a previous calibration process. The calibration process may be repeated periodically over the life of the flash memory, as the memory ages.

In an act 325 it is determined whether the decoding attempt succeeded; if it did, the process proceeds to the generation of new or updated lookup tables using statistics collection and calculation of estimated log likelihood ratios. If the decoding attempt failed, then the process proceeds to a different error correction code decoding attempt, using a subset of (i.e., fewer than all of) the raw data words. For example, in acts 330-345 that are analogous to acts 310-325, an error correction code decoding attempt may be made using all of the raw data words except one (e.g., using RD0-RD3). As another example, in acts 350-365 that are analogous to acts 310-325, an error correction code decoding attempt may be made using two of the raw data words (e.g., using RD0 and RD1). Similarly, in other sets of acts illustrated in FIG. 3A with an ellipsis (". . . ") other subsets of the raw data words may be used. In general, up to $2^N-N-1$ soft decision error correction code decoding attempts may be made, using all of the raw data words or various subsets of the raw data words. For the case in which five references voltages are available (illustrated, e.g., in FIG. 2), there may be $2^5-6=26$ ways to perform soft decision error correction code decoding attempts. In some embodiments, fewer decoding attempts may be made.

If none of the soft decision error correction code decoding attempts succeeds, the system may, in an act 370, perform one or more hard decision error correction code decoding attempts. Details of the act 370, in one embodiment, are illustrated in FIG. 3B. In acts 375 and 380, an error correction code decoding attempt is made using the raw data word from the first read operation (e.g., RD0, in FIG. 2). In an act 385, it is determined whether the decoding attempt succeeded; if it did, the process proceeds to the generation of new or updated lookup tables using statistics collection and calculation of estimated log likelihood ratios. If the decoding attempt failed, then the process proceeds to a different error correction code decoding attempt, using another raw data word. As illustrated in FIG. 3B with an ellipsis (". . . "), the different error correction code decoding attempts may use, for example, the raw data word from the second read operation, or from another subsequent read operation, until, in acts 390 and 392 that are analogous to acts 375 and 380, an error correction code decoding attempt is made using the final remaining raw data word (e.g., the raw data word RD(N−1) resulting from the last read operation of the N read operations). If the final error correction code decoding attempt fails, then, in an act 396, the process may be repeated (beginning with soft decision error correction code decoding attempts, e.g., acts 310-325), using a different code word. In some alternate embodiments, bit differences (i.e., bit flips) may be identified by comparing the data in the raw data words with data reconstructed from another source, so that bit flip statistics may be collected in act 396 even if error correction code decoding is unsuccessful. For example, a code word reserved for this purpose may initially be programmed with pseudorandom data produced by a known algorithm using a known seed, or with data also stored elsewhere (e.g., in another part of the flash memory), and protected using a stronger error correcting code.

Figure 4:
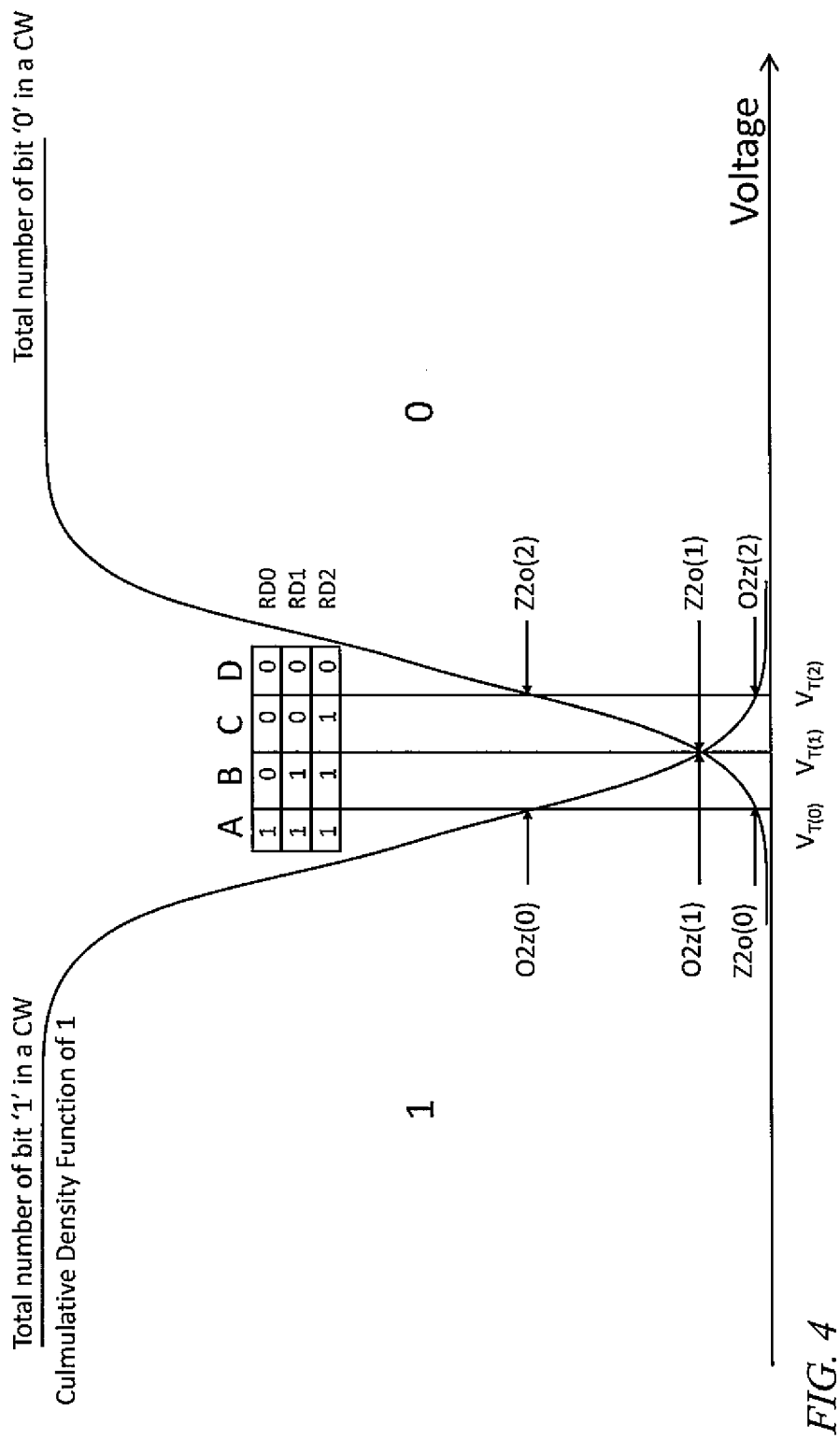
FIG. 4 is a graph of cumulative distribution functions, according to an embodiment of the present invention.

FIG. 4 shows scaled cumulative distribution functions corresponding to probability density functions such as those of FIG. 1B. The scaled cumulative distribution functions are scaled to the total number of "1" bits in the code word (i.e., the total number of bits to which a 1 was written when the flash memory was programmed, denoted $C_1$) and to the total number of "0" bits in the code word (i.e., the total number of bits to which a 0 was written when the flash memory was programmed, denoted $C_0$), respectively. In FIG. 4, Z2o(x) is the zero to one flip count at voltage threshold $V_{T(x)}$; O2z(x) is the one to zero lip count at voltage threshold $V_{T(x)}$.

Guided by the illustration of FIG. 4, it may be seen that the log likelihood ratio may be estimated from adjacent bit flip count values, e.g., LLR(x)=C*log$_2$(delta(Z2o(x))/delta(O2z(x)))

Where log$_2$ is a logarithm to the base 2, the constant C has a value (e.g., C=log(2)) such that C*log$_2$(x)=log(x), and each "delta" value is a difference of neighboring values of Z2o or O2z, when the neighboring value exists.

For example delta(Z2o(x))=Z2o(x)-Z2o(x-1), and delta(O2z(x))=O2z(x-1)-O2z(x).

where x is an index that indicates either a region or a reference voltage. For example, in FIG. 4, the reference voltage with index 0 is $V_{T(0)}$, and the region with index 0 is the region to the left of this reference voltage. The index increases rightwards in FIG. 4, so that, for example, the reference voltage with index 1 is $V_{T(1)}$, and the region with index 1 is the region between $V_{T(0)}$ and $V_{T(1)}$.

For the case of FIG. 4, with three reference voltages and four regions, the expressions are:

delta(Z2o(0))=Z2o(0)

delta(Z2o(1))=Z2o(1)-Z2o(0)

delta(Z2o(2))=Z2o(2)-Z2o(1), delta(Z2o(3))=$C_0$-Z2o(3), delta(O2z(0))=C1-O2z(0), delta(O2z(1))=O2z(0)-O2z(1), delta(O2z(2))=O2z(1)-O2z(2), and delta(O2z(3))=O2z(2).

For the case of FIG. 4, with three reference voltages and four regions, lookup tables may be formed for the following cases. For two reads, there may be three lookup tables, each corresponding to one the following pairs of reference voltages used for the two reads: $\{V_T, V_{T-}\}$, $\{V_T, V_{T+}\}$ and $\{V_{T-}, V_{T+}\}$. For three reads, there may be one lookup table, corresponding to reads performed with the following reference voltages: $\{V_{T-}, V_T, V_{T+}\}$. For one read, there may be three lookup tables, each corresponding to a read performed with one of the following reference voltages: $\{V_{T-}\}$, $\{V_{T+}\}$ and $\{V_{T+}\}$. In this embodiment, up to 7 lookup tables may be generated.

The above system and method may also be employed for MLC and TLC flash memory cells. For example, an MLC cell may be programmed to be in one of four states S0, S1, S2, and S3 (these four states corresponding, for example, to four different amounts of stored charge on the floating gate of the flash memory cell), and a bit flip may occur, for example, if a cell that was programmed with S3 is read as S2. In MLC and TLC, a different set of reference voltages may be applied for each of the lower, middle (in the case of TLC), and upper page. The same approach as is described above in the context of a single level cell may be applied to MLC and TLC cells to determine whether the threshold voltage is above or below any of the reference voltages. Each set of reference voltages may be used to distinguish between any pair of states, e.g., three reference voltages ($V_{23-}$, $V_{23}$, and $V_{23+}$), all selected to be near the nominal boundary between S2 and S3, may be used to determine whether a cell is in state S2 or S3. As in the examples described above for single-level cells, log likelihood ratios may be estimated for each type of bit flip (including o2z, z2o), using a calibration method in which, after a successful error correction code decoding attempt, bitflips are counted and the log likelihood ratios are estimated accordingly.

Figure 5:
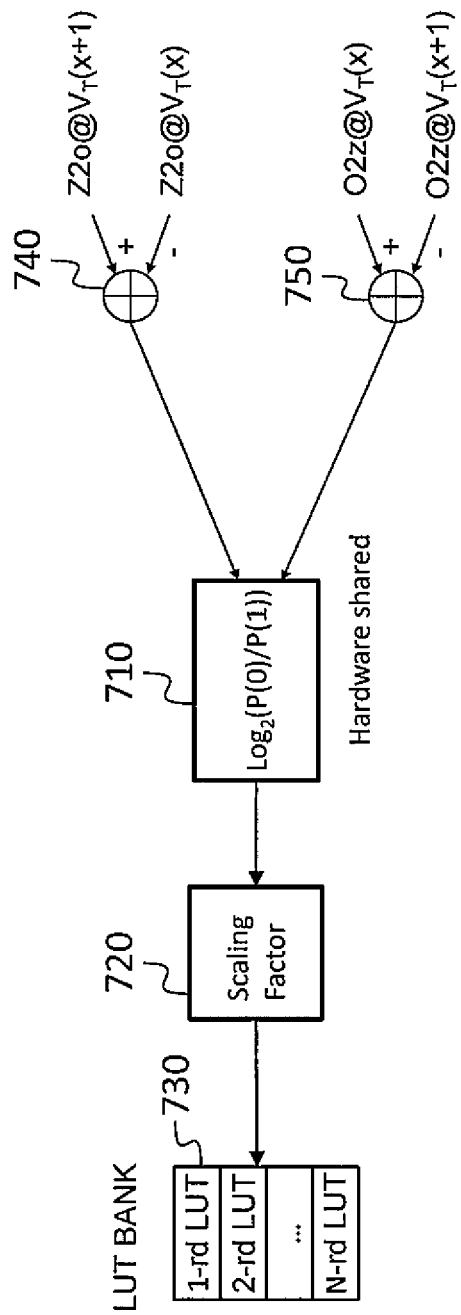
FIG. 5 is a flow chart of a method for calculating a log likelihood ratio, according to an embodiment of the present invention.

FIG. 5 illustrates for the example of a reference voltage of $V_T$, the calculation of a scaled log likelihood ratio, as the final act in creating an entry for one of the lookup tables. In acts 740 and 750 the difference is calculated for flip counts from zero to one and from one to zero, in each case between 2 adjacent voltage thresholds. In an act 710 the log likelihood ratio is calculated, in an act 720 the log likelihood ratio is scaled, i.e., a scaling factor is applied, and in an act 730 the result is stored in the appropriate lookup table of the multiple lookup tables. The calibration process may be a process that is not time-critical, and accordingly the logarithmic logic 710 and difference logic 740 750 may be shared during the calculation of different LUTs. The CPU sub-system 230 (FIG. 2) may collect the LUT in act 730 for future usage and/or store the calculated values in the LUT 255 (FIG. 2) for more accurate LLR translation.

In some embodiments, measures are taken to insure the reference voltages for normal multiple-read soft-decision decoding are the same as the reference voltages used for LUT calibration.

In light of the foregoing, a solid state drive may employ adaptive multiple-read to perform enhanced performance error correction using soft decisions without a performance penalty that otherwise might result from performing unnecessary reads. The soft decision error correcting algorithm may employ lookup tables containing log likelihood ratios, and these lookup tables may be generated by a calibration process. The calibration process may involve making different error correcting code decoding attempts until one succeeds, and then calculating the log likelihood ratios from counts of flipped bits, i.e., bits in the raw data read from the memory having a different value than the corresponding bits in the decoded data.

Various processing operations described above may be performed by the controller of the solid state drive 110. The controller may be a processing circuit. The term "processing circuit" is used herein to include any combination of hardware, firmware, and software, employed to process data or digital signals. Processing circuit hardware may include, for example, application specific integrated circuits (ASICs), general purpose or special purpose central processing units (CPUs), digital signal processors (DSPs), graphics processing units (GPUs), and programmable logic devices such as field programmable gate arrays (FPGAs). In a processing circuit, as used herein, each function is performed either by hardware configured, i.e., hard-wired, to perform that function, or by more general purpose hardware, such as a CPU, configured to execute instructions stored in a non-transitory storage medium. A processing circuit may be fabricated on a single printed circuitboard (PCB) or distributed over several interconnected PCBs. A processing circuit may contain other processing circuits; for example a processing circuit may include two processing circuits, an FPGA and a CPU, interconnected on a PCB.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section, without departing from the spirit and scope of the inventive concept.

The terminology used herein is for the purpose of describing particular embodiments only and is not intended to be limiting of the inventive concept. As used herein, the terms "substantially," "about," and similar terms are used as terms of approximation and not as terms of degree, and are intended to account for the inherent deviations in measured or calculated values that would be recognized by those of ordinary skill in the art. As used herein, the term "major component" means a component constituting at least half, by weight, of a composition, and the term "major portion", when applied to a plurality of items, means at least half of the items.

As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the present invention". Also, the term "exemplary" is intended to refer to an example or illustration. As used herein, the terms "use," "using," and "used" may be considered synonymous with the terms "utilize," "utilizing," and "utilized," respectively.

It will be understood that when an element or layer is referred to as being "on", "connected to", "coupled to", or "adjacent to" another element or layer, it may be directly on, connected to, coupled to, or adjacent to the other element or layer, or one or more intervening elements or layers may be present. In contrast, when an element or layer is referred to as being "directly on", "directly connected to", "directly coupled to", or "immediately adjacent to" another element or layer, there are no intervening elements or layers present.

Although exemplary embodiments of a method of flash channel calibration have been specifically described and illustrated herein, many modifications and variations will be apparent to those skilled in the art. Accordingly, it is to be understood that a method of flash channel calibration practiced according to principles of this invention may be embodied other than as specifically described herein. The invention is also defined in the following claims, and equivalents thereof.

What is claimed is:

1. A method, comprising:
   calibrating a flash memory; and
   performing an adaptive multi-read operation based on the calibration,
   the calibrating comprising:
   performing a first read operation on a first plurality of flash memory cells, at a first word line voltage, to form a first raw data word;
   performing a second read operation on the first plurality of flash memory cells, at a second word line voltage, to form a second raw data word;
   executing a first error correction code decoding attempt with a first set of one or more raw data words including the first raw data word;
   determining that the first error correction code decoding attempt has succeeded; and
   based on the determining that the first error correction code decoding attempt has succeeded:
   generating,
     from bit differences between
       the first set of one or more raw data words and
       one or more corresponding decoded data words generated by the first error correction code decoding attempt,
     a first lookup table including:
       a first log likelihood ratio corresponding to a first range of word line voltages and
       a second log likelihood ratio corresponding to a second range of word line voltages; and
   generating,
     from bit differences between
       a second set of two or more raw data words and
       two or more corresponding decoded data words generated by the first error correction code decoding attempt,
     a second lookup table including:
       a third log likelihood ratio corresponding to a third range of word line voltages;
       a fourth log likelihood ratio corresponding to a fourth range of word line voltages; and
       a fifth log likelihood ratio corresponding to a fifth range of word line voltages.

2. The method of claim 1, wherein:
   the third log likelihood ratio corresponds to the first range of word line voltages;
   the third log likelihood ratio equals the first log likelihood ratio;
   the fourth range of word line voltages is a sub-range of the second range of word line voltages; and
   the fifth range of word line voltages is a sub-range of the second range of word line voltages.

3. The method of claim 1, further comprising, based on the determining that the first error correction code decoding attempt has succeeded:
   generating,
     from bit differences between
       a third set of three or more raw data words and
       three or more corresponding decoded data words generated by the first error correction code decoding attempt,
     a third lookup table including:
       a sixth log likelihood ratio corresponding to a sixth range of word line voltages;
       a seventh log likelihood ratio corresponding to a seventh range of word line voltages;
       an eighth log likelihood ratio corresponding to an eighth range of word line voltages; and
       a ninth log likelihood ratio corresponding to a ninth range of word line voltages.

4. The method of claim 1, wherein the first error correction code decoding attempt is a soft decision input error correction code decoding attempt.

5. The method of claim 4, wherein the first error correction code decoding attempt comprises a decoding attempt utilizing a low density parity check algorithm.

6. The method of claim 5, further comprising:
performing a third read operation on a second plurality of flash memory cells, at the first word line voltage, to form a third raw data word;
performing a fourth read operation on the second plurality of flash memory cells, at the second word line voltage, to form a fourth raw data word;
executing a second error correction code decoding attempt with a third set of one or more raw data words including the third raw data word;
determining that the second error correction code decoding attempt has not succeeded; and
based on the determining that the first error correction code decoding attempt has not succeeded:
executing a third error correction code decoding attempt with one or more raw data words not including the third raw data word.

7. The method of claim 1, further comprising:
performing a third read operation on a second plurality of flash memory cells, at the first word line voltage, to form a third raw data word;
performing a fourth read operation on the second plurality of flash memory cells, at the second word line voltage, to form a fourth raw data word;
executing a second error correction code decoding attempt with a third set of one or more raw data words including the third raw data word;
determining that the second error correction code decoding attempt has not succeeded; and
based on the determining that the first error correction code decoding attempt has not succeeded:
executing a third error correction code decoding attempt with one or more raw data words not including the third raw data word.

8. The method of claim 7, wherein the second error correction code decoding attempt is a soft decision input error correction code decoding attempt.

9. The method of claim 7, wherein the second error correction code decoding attempt is a hard decision input error correction code decoding attempt.

10. The method of claim 1, further comprising:
performing a third read operation on a second plurality of flash memory cells, at the first word line voltage, to form a third raw data word;
performing a fourth read operation on the second plurality of flash memory cells, at the second word line voltage, to form a fourth raw data word;
executing a second error correction code decoding attempt with a third set of one or more raw data words including the third raw data word;
determining that the second error correction code decoding attempt has not succeeded; and
based on the determining that the first error correction code decoding attempt has not succeeded:
generating the first lookup table and the second lookup table from bit differences between the third set of one or more raw data words and a data set reconstructed from separately stored information.

11. The method of claim 1, wherein the first log likelihood ratio is a logarithm of a ratio of
a probability of a threshold word line voltage, at which a flash memory cell transistor of a flash memory cell of the flash memory is configured to transition between an on state and an off state, being within the first range of word line voltages if the flash memory cell was most recently programmed with a logical 1, and
a probability of the threshold word line voltage being within the first range of word line voltages if the flash memory cell was most recently programmed with a logical 0.

12. A solid state drive, comprising:
a controller; and
flash memory,
the controller being to:
calibrate the flash memory, and
perform an adaptive multi-read operation based on the calibration,
the calibrating comprising:
performing a first read operation on a first plurality of flash memory cells of the flash memory, at a first word line voltage, to form a first raw data word;
performing a second read operation on the first plurality of flash memory cells, at a second word line voltage, to form a second raw data word;
executing a first error correction code decoding attempt with a first set of one or more raw data words including the first raw data word;
determining that a first error correction code decoding attempt has succeeded; and
based on the determining that the first error correction code decoding attempt has succeeded:
generating,
from bit differences between
a second set of one or more raw data words and one or more corresponding decoded data words generated by the first error correction code decoding attempt,
a first lookup table including:
a first log likelihood ratio corresponding to a first range of word line voltages and
a second log likelihood ratio corresponding to a second range of word line voltages; and
generating,
from bit differences between
a second set of two or more raw data words and two or more corresponding decoded data words generated by the first error correction code decoding attempt,
a second lookup table including:
a third log likelihood ratio corresponding to a third range of word line voltages;
a fourth log likelihood ratio corresponding to a fourth range of word line voltages; and
a fifth log likelihood ratio corresponding to a fifth range of word line voltages.

13. The solid state drive of claim 12, wherein the controller is further configured to, based on the determining that the first error correction code decoding attempt has succeeded,
generate,
from bit differences between
a third set of three or more raw data words and three or more corresponding decoded data words generated by the first error correction code decoding attempt,
a third lookup table including:
a sixth log likelihood ratio corresponding to a sixth range of word line voltages;
a seventh log likelihood ratio corresponding to a seventh range of word line voltages;

an eighth log likelihood ratio corresponding to an eighth range of word line voltages; and
a ninth log likelihood ratio corresponding to a ninth range of word line voltages.

14. The solid state drive of claim 12, wherein the first error correction code decoding attempt is a soft decision input error correction code decoding attempt.

15. The solid state drive of claim 14, wherein the first error correction code decoding attempt comprises a decoding attempt utilizing a low density parity check algorithm.

16. The solid state drive of claim 15, wherein the controller is further configured to:
perform a third read operation on a second plurality of flash memory cells, at the first word line voltage, to form a third raw data word;
perform a fourth read operation on the second plurality of flash memory cells, at the second word line voltage, to form a fourth raw data word;
execute a second error correction code decoding attempt with a third set of one or more raw data words including the third raw data word;
determine that the second error correction code decoding attempt has not succeeded; and
based on the determining that the first error correction code decoding attempt has not succeeded:
execute a second error correction code decoding attempt with one or more raw data words not including the first raw data word.

17. The solid state drive of claim 12, wherein the controller is further configured to:
perform a third read operation on a second plurality of flash memory cells, at the first word line voltage, to form a third raw data word;
perform a fourth read operation on the second plurality of flash memory cells, at the second word line voltage, to form a fourth raw data word;
execute a second error correction code decoding attempt with a third set of one or more raw data words including the third raw data word;
determine that the second error correction code decoding attempt has not succeeded; and
based on the determining that the first error correction code decoding attempt has not succeeded:
execute a second error correction code decoding attempt with one or more raw data words not including the first raw data word.

18. The solid state drive of claim 17, wherein the second error correction code decoding attempt is a soft decision input error correction code decoding attempt.

19. The solid state drive of claim 17, wherein the second error correction code decoding attempt is a hard decision input error correction code decoding attempt.

20. The solid state drive of claim 12, wherein the controller is further configured to:
perform a third read operation on a second plurality of flash memory cells, at the first word line voltage, to form a third raw data word;
perform a fourth read operation on the second plurality of flash memory cells, at the second word line voltage, to form a fourth raw data word;
execute a second error correction code decoding attempt with a third set of one or more raw data words including the third raw data word;
determine that the second error correction code decoding attempt has not succeeded; and
based on the determining that the first error correction code decoding attempt has not succeeded:
generate the first lookup table and the second lookup table from bit differences between the third set of one or more raw data words and a data set reconstructed from separately stored information.

21. The solid state drive of claim 12, wherein the first log likelihood ratio is a logarithm of a ratio of
a probability of a threshold word line voltage, at which a flash memory cell transistor of a flash memory cell of the flash memory is configured to transition between an on state and an off state, being within the first range of word line voltages if the flash memory cell was most recently programmed with a logical 1, and
a probability of the threshold word line voltage being within the first range of word line voltages if the flash memory cell was most recently programmed with a logical 0.

* * * * *